US008154110B2

(12) United States Patent  
Ishihara et al.

(10) Patent No.: US 8,154,110 B2  
(45) Date of Patent: Apr. 10, 2012

(54) DOUBLE-FACED ELECTRODE PACKAGE AND ITS MANUFACTURING METHOD

(75) Inventors: Masamichi Ishihara, Kitakyushu (JP); Harufumi Kobayashi, Tokyo (JP)

(73) Assignee: Oki Semiconductor Co., Ltd, Tokyo (JP)

(*) Notice: Subject to any disclaimer, the term of this patent is extended or adjusted under 35 U.S.C. 154(b) by 554 days.

(21) Appl. No.: 12/093,708

(22) PCT Filed: Nov. 2, 2006

(86) PCT No.: PCT/JP2006/321956  
§ 371 (c)(1),  
(2), (4) Date: May 14, 2008

(87) PCT Pub. No.: WO2007/058074  
PCT Pub. Date: May 24, 2007

(65) Prior Publication Data  
US 2009/0224381 A1 Sep. 10, 2009

(30) Foreign Application Priority Data

Nov. 16, 2005 (JP) ................................. 2005-331156

(51) Int. Cl.  
*H01L 23/34* (2006.01)

(52) U.S. Cl. ................................. 257/673; 257/E23.033

(58) Field of Classification Search .................. 257/673, 257/666, 670–672, 737, 735, 738, E23.033  
See application file for complete search history.

(56) References Cited

U.S. PATENT DOCUMENTS

| 6,590,281 B2 * | 7/2003 | Wu et al. ........................ 257/684 |
| 2002/0060361 A1 | 5/2002 | Sasaki |

FOREIGN PATENT DOCUMENTS

| JP | 06-252334 | 9/1994 |
| JP | 11-307675 | 11/1999 |
| JP | 2002-26250 | 1/2002 |
| JP | 2002-158312 | 5/2002 |
| JP | 2003-174122 | 6/2003 |
| JP | 2003-249604 | 9/2003 |
| JP | 2005-019814 | 1/2005 |

* cited by examiner

*Primary Examiner* — Hoa B Trinh  
(74) *Attorney, Agent, or Firm* — McGlew and Tuttle, P.C.

(57) ABSTRACT

A dual-face package has an LSI chip sealed with a mold resin, and electrodes for external connections on both of the front face and the back face. The LSI chip is bonded onto the die pad of a leadframe whose outer lead portions are exposed as back-face electrodes at least the back face. The LSI chip and a plurality of inner lead portions of the leadframe are connected by wiring. At least some of the plurality of inner lead portions have front-face electrodes integrally formed by working a portion of the leadframe. Head faces of the front-face electrodes, or bump electrodes connected to the respective head faces of the front-face electrodes serve as electrodes for external connections to another substrate, element, or the like.

6 Claims, 4 Drawing Sheets

DOUBLE-FACED ELECTRODE PACKAGE AND ITS MANUFACTURING METHOD

TECHNICAL FIELD

The present invention relates to a dual-face package in which an LSI chip is sealed with a mold resin and which has electrodes for external connections on both of the front face and the back face, as well as to a method for manufacturing the same.

BACKGROUND ART

In association with an increase in the degree of integration of LSI chips, there has been a strong demand for a reduction in package size. Under the circumstances, various package structures have been proposed. In recent years, developments have been carried out intensively for stacking semiconductor bare chips through utilization of through-silicon vias formed therein. Meanwhile, dual-face packages of real chip size are also highly likely to be commercialized. Conventional dual-face packages of any technology require a through-silicon via structure (refer to Patent Documents 1 and 2). Since existing insulation methods for through holes in a semiconductor substrate involve high-temperature treatment, application of such the insulation methods to a semiconductor packaging process is difficult. Formation of through holes in a semiconductor substrate and insulation for the through holes still involve problems to be solved; therefore, wiring without need of through-silicon vias is desired.

Patent Document 1: Japanese Patent Application Laid-Open (kokai) No. 2003-249604
Patent Document 2: Japanese Patent Application Laid-Open (kokai) No. 2002-158312

DISCLOSURE OF THE INVENTION

Problems to be Solved by the Invention

An object of the present invention is to solve the above-mentioned problems and to readily manufacture a dual-face package without need of the through-silicon via technology. The invention enables the manufacture of a leadframe-type dual-face package. In addition to application to mobile phones as conventionally practiced, the leadframe-type dual-face package can be effectively used as a package for various sensors (sound sensors, magnetic sensors, pressure sensors, etc.).

Means for Solving the Problems

A dual-face package of the present invention has an LSI chip sealed with a mold resin, and electrodes for external connections on both of a front face and a back face. The LSI chip is bonded onto a die pad of a leadframe whose outer lead portions are exposed as back-face electrodes at least the back face. The LSI chip and a plurality of inner lead portions of the leadframe are connected by wiring. At least some of the plurality of inner lead portions have front-face electrodes integrally formed by working a portion of the leadframe. Bump electrodes connected to respective head faces of the front-face electrodes serve as electrodes for external connections to another substrate or element. The bump electrodes are arrayed at respective positions different from those where the head faces of the front-face electrodes are exposed, by means of rerouting wiring traces on the mold resin.

In another dual-face package of the present invention, an LSI chip is bonded onto a die pad of a leadframe whose outer lead portions are exposed as back-face electrodes at least the back face; the LSI chip and inner lead portions of the leadframe are connected by wiring; stud bumps are connected to the respective inner lead portions; bump electrodes connected to respective head faces of the stud bumps serve as front-face electrodes for connections to another substrate or element; and the bump electrodes are arrayed at respective positions different from those where the head faces of the stud bumps are exposed, by means of rerouting wiring traces on the mold resin.

A method for manufacturing a dual-face package of the present invention comprises unitarily forming a large number of leadframes each having outer lead portions exposed as back-face electrodes at least the back face; integrally forming front-face electrodes on at least some of the plurality of inner lead portions of the leadframe by drawing a portion of the leadframe; bonding LSI chips onto respective die pads of the leadframes; connecting each of the LSI chips and the plurality of inner lead portions of corresponding one of the leadframes by wiring; carrying out batch sealing with a mold resin; and exposing head faces of the front-face electrodes, or bump electrodes connected to the respective head faces of the front-face electrodes at a surface of the mold resin so as to make the head faces or bump electrodes serve as electrodes for external connections to another substrate or element, followed by cutting for singulation.

Another method for manufacturing a dual-face package of the present invention comprises unitarily forming a large number of leadframes each having outer lead portions exposed as back-face electrodes at least the back face; bonding LSI chips onto respective die pads of the leadframes; connecting each of the LSI chips and inner lead portions of corresponding one of the leadframes by wiring; connecting stud bumps to the respective inner lead portions; carrying out batch sealing with a mold resin, followed by cutting for singulation; and exposing bump electrodes connected to respective head faces of the stud bumps at a surface of the mold resin so as to make the bump electrodes serve as front-face electrodes for external connections to another substrate or element.

EFFECTS OF THE INVENTION

Since the present invention enables the manufacture of a dual-face package without need to form through-silicon vias, the present invention can provide a dual-face package which can not only be applied to mobile phones as practiced conventionally but also be effectively used as a package for various sensors (sound sensors, magnetic sensors, pressure sensors, etc.).

The present invention provides a dual-face package which can be applied to those fields which use those packages whose double-faced-electrode feature cannot be implemented in the wafer stage because of small chip size. The present invention can be effectively applied to packaging for, for example, DSP packages connected directly to microphones, and processor LSIs of small chip sizes for magnetic sensors and pressure sensors. The present invention allows use of an ordinary leadframe technology and thus can provide a dual-face package at low cost.

BEST MODE FOR CARRYING OUT THE INVENTION

Figure 1:
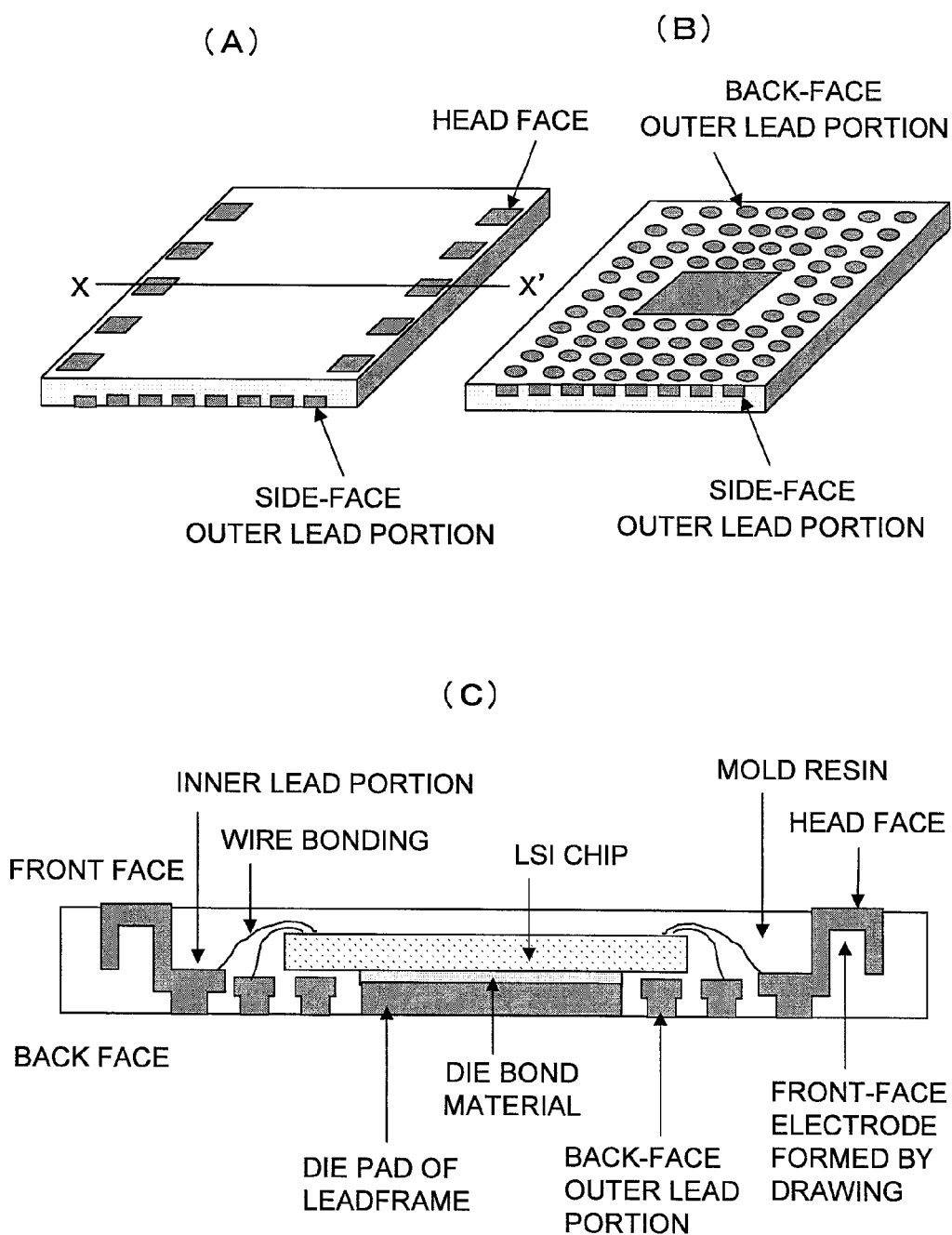
FIG. 1 is a series of views showing a first embodiment of a leadframe-type dual-face package according to the present invention, wherein (A) is a perspective front view, (B) is a perspective rear view, and (C) is a sectional view taken along line X¾X' of view (A).

Embodiments of a dual-face package according to the present invention will next be described. Not only can the dual-face package of the present invention be used singly, but also the dual-face packages of the present invention can be stacked in such a manner that vertically adjacent dual-face packages are connected to each other, so as to be used as a single stacked semiconductor device. FIG. 1 shows a first embodiment of a leadframe-type dual-face package according to the present invention. In FIG. 1, (A) is a perspective front view; (B) is a perspective rear view; and (C) is a sectional view taken along line X¾X' of view (A). The illustrated leadframe-type dual-face package has front-face electrodes which are formed by drawing such that head faces thereof are exposed on the front side. The head faces of the front-face electrodes function as terminals for external connections.

As shown in the sectional view of FIG. 1(C), an LSI chip is bonded onto a die pad of the leadframe by use of a die bond material, such as Ag paste (chip die bond). Although a single LSI chip is illustrated, a plurality of LSI chips can be stacked. Inner lead portions of the leadframe and the LSI chip are connected by means of Au wires (wire bond). The ends of outer lead portions of the leadframe for electrically connecting the leadframe to a peripheral circuit are exposed at not only the back face of a mold (back-face outer lead portions) but also the side faces of the mold (side-face outer lead portions).

The front-face electrodes are formed by drawing a portion of the leadframe, in such a manner as to be integral with a portion of the inner lead portions and a portion of the outer lead portions (back-face or side-face outer lead portions). In the illustrated embodiment, a portion of the leadframe is worked so as to form three-dimensionally projecting portions, and the electrodes on both faces of the package are formed by utilization of the projecting portions. A large number of leadframes are unitarily formed by press working from, for example, a metal sheet of a Cu alloy plated with Pd (in a later step, a large number of leadframes formed unitarily undergo cutting for singulation). During the press working, portions corresponding to the front-face electrodes can be simultaneously formed by drawing. Alternatively, after the leadframes are formed by press working in an ordinary manner, a portion of each of the leadframes can be subjected to drawing.

Figure 2:
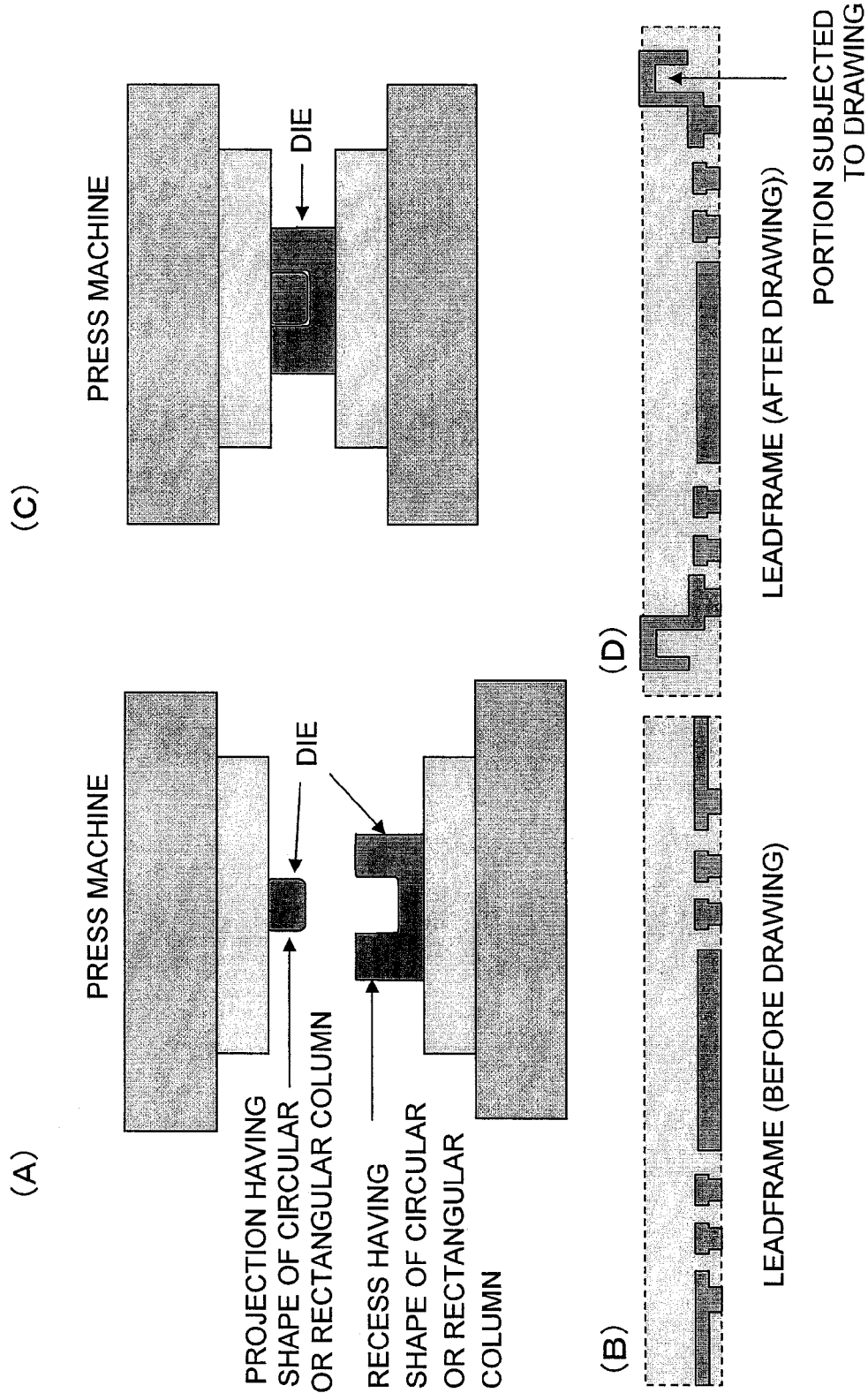
FIG. 2 is a series of views for explaining a process of drawing a portion of a leadframe, wherein (A) is a sectional view showing a state of a press machine in which a die is opened, (B) is a sectional view showing the leadframe before drawing, (C) is a sectional view showing a state of the press machine in which the die is closed, and (D) is a sectional view showing the leadframe after drawing.

FIG. 2 is a series of views for explaining a process of drawing a portion of the leadframe, wherein (A) is a sectional view showing a state of a press machine in which a die is opened, (B) is a sectional view showing the leadframe before drawing, (C) is a sectional view showing a state of the press machine in which the die is closed, and (D) is a sectional view showing the leadframe after drawing. As shown in FIG. 2(A), one die has a projection of a drawing shape of, for example, circular column or rectangular column. The other die has a recess whose shape coincides with the projection.

The leadframe before drawing shown in FIG. 2(B) is set in the press machine whose die is opened as shown in view (A), such that its portion to be subjected to drawing is placed in the opened die. Then, press working is carried out as shown in view (C). The leadframe after press working is shown in view (D). In views (B) and (D), the rectangle depicted by the dotted line imaginarily shows the outline of a final product. The leadframe before press working shown in view (B) can have a known configuration for use in, for example, a batch-sealed leadframe-type package (generally, a Quad Flat Non-lead (QFN) package).

Figure 3:
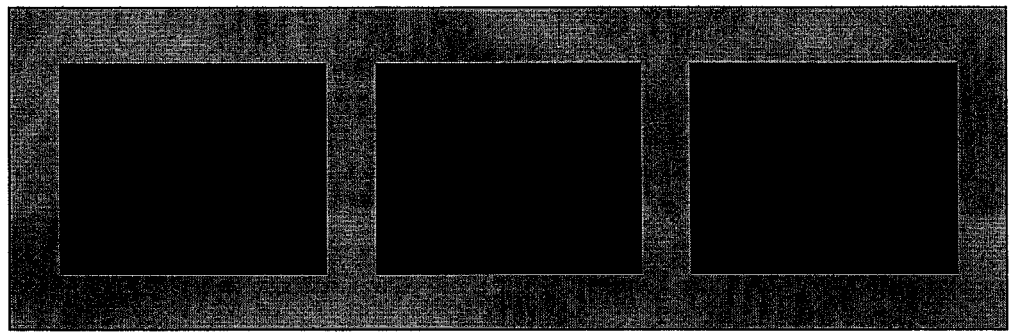
FIG. 3 is a view showing leadframes or organic substrates which are batch-molded into the form of islands.

As shown in FIG. 1(C), after wire bonding, the leadframe is sealed with epoxy resin in order to protect the leadframe from subjection to external stress and contamination. FIG. 3 shows the leadframes which are batch-molded into the form of islands (this also applies to organic multilayer or single-layer substrates, which will be described later). If the head faces of the front-face electrodes are not properly exposed at the front face of the mold, the upper surface of the mold is ground or polished so as to properly expose the head faces of the front-face electrodes.

The front-face electrodes may be used as electrodes for external connections. However, the electrodes for external connections can be relocated from a front-face electrode array to, for example, an area array by means of an ink jet process or screen printing. For this relocation, first, rerouting wiring traces to be connected to the respective head faces of the front-face electrodes are formed on the front face of the mold by means of an ink jet process (or screen printing) while using metal nanoparticles. Metal nanoparticles are of copper, silver, gold, or the like. By use of such metal nanoparticles, wiring traces are directly drawn by an ink jet process. More specifically, a required wiring pattern is drawn by an ink jet process employed in printers, while using an organic solvent which contains metal nanoparticles. In the case of screen printing, a nanopaste formed by mixing metal nanoparticles in an organic solvent is applied onto a substrate by screen printing; subsequently, firing through application of heat is carried out, thereby forming circuit wiring.

Figure 4:
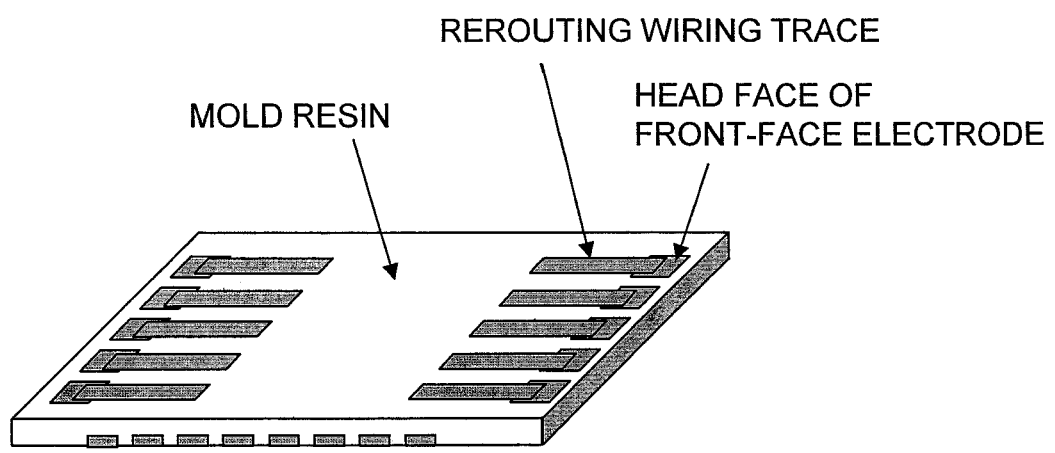
FIG. 4 is a view showing rerouting wiring traces on the upper surface of a mold of a single chip.

FIG. 4 illustrates rerouting wiring traces on the upper surface of the mold of a single chip. After a protection film is formed on the rerouting wiring traces, openings are formed in the protection film at the respective positions where bumps are to be formed on the respective rerouting wiring traces. Bump electrodes for external connections can be formed in the respective openings. For formation of the bump electrodes, the protection film can be selectively formed by an ink jet process in such a manner as to avoid the positions where the bump electrodes are to be formed. By this procedure, the bump electrodes can be arrayed at respective positions different from those where the head faces of the front-face electrodes are exposed.

Next, cutting is carried out for chip singulation. A large number of leadframes formed unitarily from a metal sheet undergo cutting for singulation, thereby yielding individual products.

As described above, in the illustrated package, the formation of electrodes on both faces of the package can be implemented by means of intrapackage connections; i.e., by means of devising bonding wire, without need to use side-face wiring.

Figure 5:
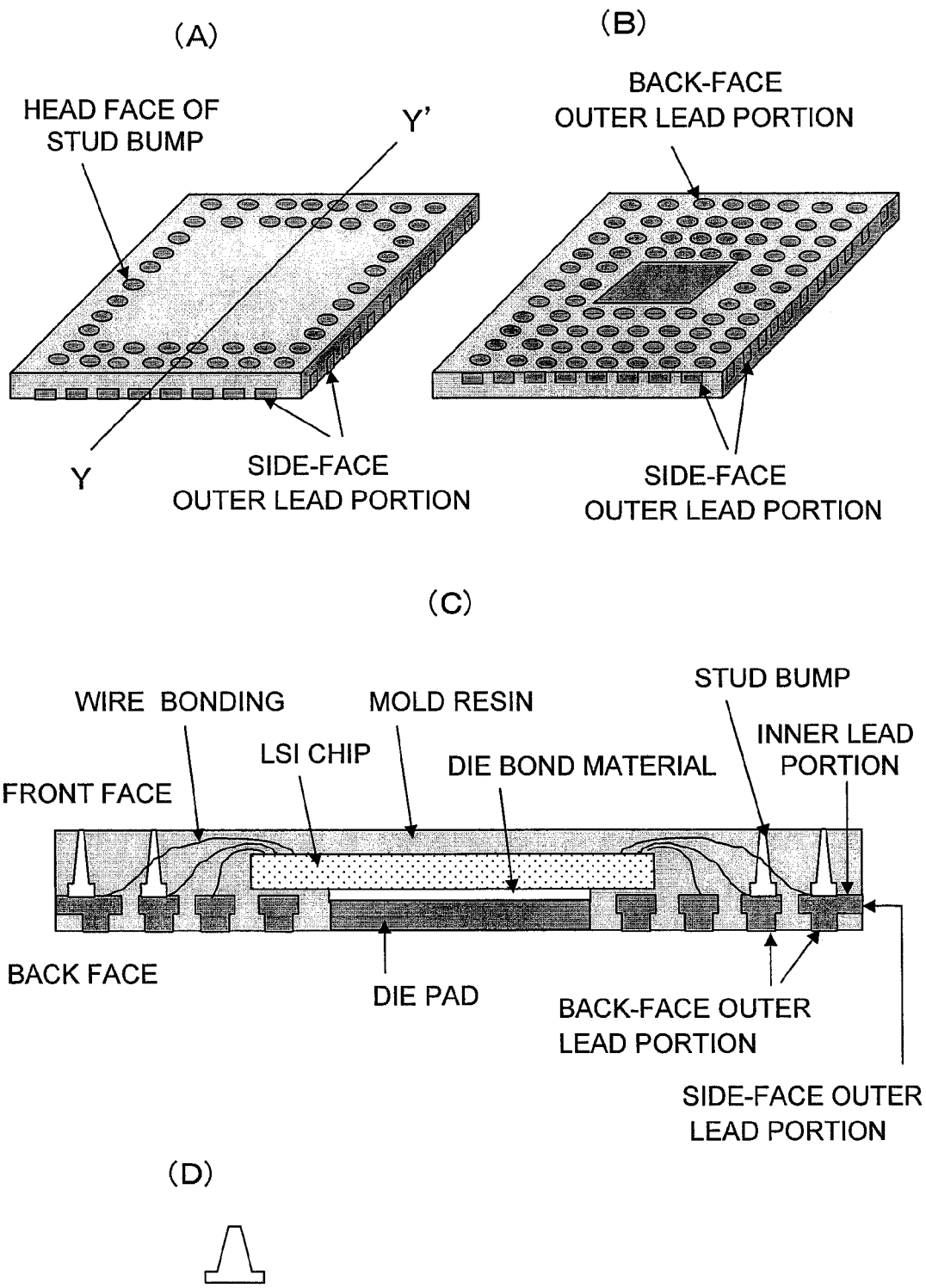
FIG. 5 is a series of views showing a second embodiment of a leadframe-type dual-face package according to the present invention, wherein (A) is a perspective front view, (B) is a perspective rear view, (C) is a sectional view taken along line Y¾Y' of view (A), and (D) is a view of a single stud bump.

FIG. 5 shows a second embodiment of a leadframe-type dual-face package according to the present invention. In FIG. 5, (A) is a perspective front view; (B) is a perspective rear view; (C) is a sectional view taken along line Y¾Y' of view (A); and (D) is a view of a single stud bump. In the illustrated leadframe-type dual-face package, the head faces of stud bumps which are exposed on the front side function as terminals for external connections.

As shown in the sectional view of FIG. 5(C), an LSI chip is bonded onto a die pad of the leadframe by use of a die bond material, such as Ag paste (chip die bond). Although a single LSI chip is illustrated, a plurality of LSI chips can be stacked. Inner lead portions of the leadframe and the LSI chip are connected by means of Au wires (wire bond). The ends of outer lead portions of the leadframe for electrically connecting the leadframe to a peripheral circuit are exposed at not only the back face of the mold (back-face outer lead portions) but also the side faces of the mold (side-face outer lead portions).

Stud bumps are connected to the respective inner lead portions of the leadframe (a portion of or all of a plurality of inner leads). The stud bumps can be formed by use of a well known technique. According to a conventionally known technique, projecting bumps (stud bumps) are formed on respective electrodes of a semiconductor chip, and the bumps are joined directly to respective electrodes formed on a board on which the semiconductor chip is mounted. The stud bumps used in the present invention can be formed by use of such a well known technique.

As illustrated, a plurality of stud bumps are connected to the respective inner lead portions of the leadframe at wire bond positions or positions two-dimensionally shifted from the wire bond positions. Connections to another substrate or element are established via the stud bumps. The stud bumps can be connected to the respective inner lead portions of the leadframe as follows: the stud bumps, each being preformed as shown in FIG. 5(D), are bonded to the respective inner lead portions at required positions by use of a technique similar to a wire bonding technique. Alternatively, a well known technique is used as follows: an end of a wire of gold or the like is melted through application of heat so as to be formed into a ball shape; subsequently, the ball is thermo compression-bonded, in the presence of ultrasonic waves, to the corresponding inner lead portion at a required position, followed by cutting off of the wire.

After the stud bumps are connected, the stud bumps are leveled to the height of the upper face of the package. Alternatively, after the next batch-molding step for sealing, the upper surface of the mold is ground or polished, whereby the upper faces of the stud bumps can also be leveled.

After wires are bonded, and the stud bumps are connected and leveled, the leadframe is sealed with epoxy resin in order to protect the leadframe from subjection to external stress and contamination. The subsequent processing can be similar to that of the first embodiment, which has been described with reference to FIG. 1. If necessary, the upper surface of the mold is ground or polished so as to properly expose the head faces of the stud bumps. An external connection array can be relocated from a stud bump array to an area array by means of an ink jet process or screen printing. For this relocation, rerouting wiring traces are formed, and a protection film is formed on the rerouting wiring traces. Then, bump electrodes for external connections can be formed on the respective rerouting wiring traces. By this procedure, the bump electrodes can be arrayed at respective positions different from those where the head faces of the stud bumps are exposed. Next, cutting is carried out for chip singulation, thereby yielding individual products.

As described above, in the illustrated package, the formation of electrodes on both faces of the package can be implemented by means of intrapackage connections; i.e., by means of devising bonding wire, without need to use side-face wiring.

The invention claimed is:

1. A dual-face package, comprising:
a dual-face package structure including an LSI chip sealed with a mold resin, and electrodes for external connections on both of a front face and a back face of said dual-face package structure, wherein the LSI chip is bonded onto a die pad of a leadframe whose outer lead portions are exposed to define said electrodes at at least the back face, and the LSI chip and a plurality of inner lead portions of the leadframe are connected by wiring, said leadframe comprising a press worked metal sheet structure, at least a portion of said lead frame extending continuously and uninterrupted from said back face to said front face, at least one or more of the plurality of inner lead portions of said leadframe defining at least one or more of said electrodes on said front face, said at least one or more of said plurality of inner lead portions being integrally formed by drawing a portion of the leadframe, and bump electrodes being electrically connected to respective head faces of the electrodes on said front-face to define electrically conductive electrodes for electric connection to another substrate or element located outside of said dual-face package structure, the bump electrodes being arrayed at respective positions different from those where the head faces of the front-face electrodes are exposed, by means of rerouting wiring traces on the mold resin.

2. A dual-face package, comprising:
a mold resin;
an LSI chip sealed with said mold resin;
a leadframe comprising a press worked metal sheet element and a die pad, outer lead portions and inner lead portions, said inner lead portions being arranged at a position below said LSI chip;
electrodes for external connections on a front face of said mold resin and a back face of said mold resin, wherein the LSI chip is bonded onto said die pad of said leadframe, said outer lead portions being exposed to form said electrodes at at least the back face, said LSI chip and said inner lead portions of said leadframe being connected by wiring;
stud bumps connected to respective inner lead portions;
bump electrodes electrically connected to respective exposed head faces of said stud bumps, said bump electrodes defining one or more of said electrodes on said front face, said bump electrodes on said front face forming electric connections to another substrate or element outside of said mold resin, said bump electrodes being arranged at bump electrode positions, said bump electrode positions being different from a position of said exposed head faces of said stud bumps by means of rerouting wiring traces on said mold resin.

3. A dual-faced package comprising:

a substrate comprising an upper surface and a back surface;

an LSI chip bonded to an area on said upper surface of said substrate, said LSI chip comprising electrical connections;

inner lead portions within said substrate, said inner lead portions being positioned about said LSI chip at a position below said LSI chip, said inner lead portions being connected to said electrical connections;

back-face lead portions connected to a first plurality of said inner lead portions, said back-face portions comprising a back-face exposed portion, said back-face exposed portion being exposed on said back surface of said substrate;

head faces connected to a second plurality of said inner lead portions, said head faces being exposed on said upper face of said substrate, said head faces being arranged about said LSI chip, wherein a plurality of said head faces are two-dimensionally shifted from said electrical connections of said LSI chip via respective inner lead portions.

4. A dual-face package in accordance with claim 2, wherein said bump electrodes are connected to said exposed head faces via said rerouting wiring traces.

5. A dual-face package in accordance with claim 1, wherein said bump electrodes are connected to said head faces via said rerouting wiring traces.

6. A dual-face package in accordance with claim 5, wherein said electrodes on said front face are integrally connected with a portion of said inner lead portions and a portion of said outer lead portions.

* * * * *